United States Patent [19]
Lee

[11] Patent Number: 5,286,581
[45] Date of Patent: Feb. 15, 1994

[54] PHASE-SHIFT MASK AND METHOD FOR MAKING

[75] Inventor: Fourmun Lee, Chandler, Ariz.

[73] Assignee: Motorola, Inc., Schaumburg, Ill.

[21] Appl. No.: 746,546

[22] Filed: Aug. 19, 1991

[51] Int. Cl.⁵ .............................................. G03F 9/00
[52] U.S. Cl. ...................................... 430/5; 430/269; 430/311
[58] Field of Search ..................... 430/5, 22, 269, 311, 430/396

[56] References Cited

U.S. PATENT DOCUMENTS 5,045,417  9/1991  Okamoto ................................ 430/5

FOREIGN PATENT DOCUMENTS 144453  6/1991  Japan .

OTHER PUBLICATIONS

Levinson et al, "Improving Resolution in Photolithography with a Phase-Shifting Mask" (IEEE vol. ED-29, No. 12, Dec. 1982).

Primary Examiner—Marion E. McCamish
Assistant Examiner—S. Rosasco
Attorney, Agent, or Firm—Gary F. Witting; Joe E. Barbee

[57] ABSTRACT

A method is provided for fabricating a phase-shift mask (10, 30). A mask plate (11, 31) is provided. A semitransparent layer (12, 32) is deposited onto the mask plate (11, 31). The semitransparent layer (12, 32) is then patterned into a predetermined geometric pattern. The patterning of the semitransparent layer (12, 32) is then continued into the mask plate (11, 31) for a predetermined distance (38), thus providing a phase-shift mask (10, 30).

14 Claims, 2 Drawing Sheets

PHASE-SHIFT MASK AND METHOD FOR MAKING

BACKGROUND OF THE INVENTION

This invention relates, in general, to masks used in making semiconductors products, and more particularly, to making phase-shift masks.

At present, small features or small geometric patterns are created by using conventional optical photolithography. Typically, optical photolithography is achieved by projecting or transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and the dark areas are formed, they are projected onto and through a lense and subsequently onto a substrate. However, because of increased semiconductor device complexity which results in increased pattern complexity, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore, making diffraction a severe limiting factor for optical photolithography.

A conventional method of dealing with diffraction effects in optical photolithography is achieved by using a phase-shift mask, which replaces the previously discussed mask. Generally, with light being thought of as a wave, phase-shifting is a change in timing or a shift in wave form of a regular sinusoidal pattern of light waves that propagate through a transparent material. Typically, phase-shifting is achieved by passing light through areas of a transparent material of either differing thicknesses or through materials with different refractive indexes, thereby changing the phase or the periodic pattern of the light wave. Phase-shift masks reduce diffraction effects by combining both diffracted light and phase-shifted light so that constructive and destructive interference takes place. A summation of the constructive and destructive interference results in improved resolution and improved depth of focus.

Conventional phase-shift masks are made by a number of methods; however, most methods of making phase-shift masks require that a layer of opaque material be deposited onto an optically clear plate and then patterned. The patterned plate is then redeposited with a phase-shift material and is once again patterned, thereby making a phase-shift pattern made up of phase-shift elements. Thus, the typical method of making conventional phase-shift masks not only requires at least two patterning steps, but also requires a critical alignment of the phase-shift pattern to the opaque pattern as well. Additionally, in some fabrication methods of conventional phase-shift masks, not only is there a critical alignment step, but, in addition, a critical etch step is required. The critical etch forms the phase-shift elements in such a manner so that the phase-shift elements are slightly larger than the opaque material, thereby creating a phase-shift layer that slightly overhangs the opaque areas. This overhang is not only difficult to make and to control but also is susceptible to particle contamination, thereby ruining the conventional phase-shift mask.

Additionally, design of a conventional phase-shift mask is not an easy task because the phase-shift patterns or the phase-shift elements are not generically or symmetrically placed over the entire mask, but are placed only on certain portions of the mask. This design problem creates a pattern determination problem that is not easily solved. Typically, only a certain portion of the regularly repeating patterns receive phase-shift elements that are positioned between the opaque portions of the conventional phase-shift mask; however, by only placing phase-shift elements in the repeating patterns a large number of geometric patterns do not receive any benefit from phase shifting.

By way of example only, one type of phase-shift mask, as well as a detailed description of theory is disclosed in Marc D. Levenson et al., "Improving Resolution in Photolithography with a Phase-Shifting Mask," I.E.E.E. TRANSACTIONS ON ELECTRON DEVICES, VOL. ED-29, NO.12, DECEMBER, 1982 which is hereby incorporated herein by reference.

Accordingly, it is desirable to make a phase-shift mask that does not have individual phase-shift elements, that does not require an additional patterning step, that does not have a critical alignment step to properly correlate the opaque pattern to the phase-shift pattern, and that does not have a critical etch step, while still achieving benefits of using a phase-shift mask.

SUMMARY OF THE INVENTION

Briefly stated, according to the present invention, a method is provided for fabricating a phase-shift mask. A mask plate is provided. A semitransparent layer is deposited onto the mask plate. A phase-shift layer is deposited onto the semitransparent layer. The phase-shift layer and the semitransparent layer is then patterned into a predetermined geometric pattern, thereby making a phase-shift mask. Also, semitransparent layer and phase-shift layer maybe deposited in opposite order. An alternative embodiment of the present invention is provided by depositing a semitransparent layer on the mask plate. The semitransparent layer is then patterned and the pattern is continued into the mask plate to a predetermined depth or distance, thus providing a phase-shift mask.

DETAILED DESCRIPTION OF THE DRAWINGS

Figure 1:
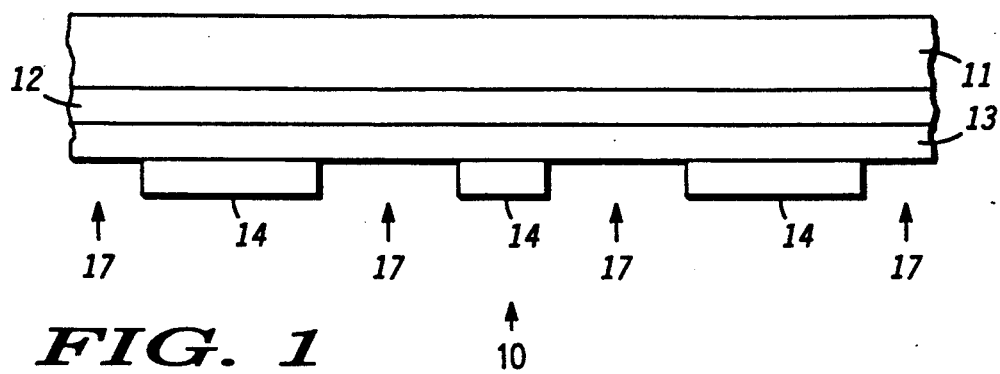
FIG. 1 illustrates an enlarged cross-section of an embodiment of the present invention that is partially prepared.

FIG. 1 is an enlarged cross-section of a portion of a reticle or a phase-shift mask 10 that is partially prepared in accordance with one embodiment of the present invention. It should be understood that only a small portion of phase-shift mask 10 is shown and that many more masking features 14 can be defined on phase-shift mask 10. Additionally, masking features 14 are shown patterned; however, a masking layer has been applied as one continuous layer and patterned by well-known methods in the semiconductor art to obtain masking features 14 on phase-shift mask 10. Also, since masking features 14 are shown in cross section, many different geometric shapes can be represented, such as lines, rectangles, circles, and the like. In the present invention, a combination of processes and materials are used for making and using a novel phase-shift mask.

Figure 2:
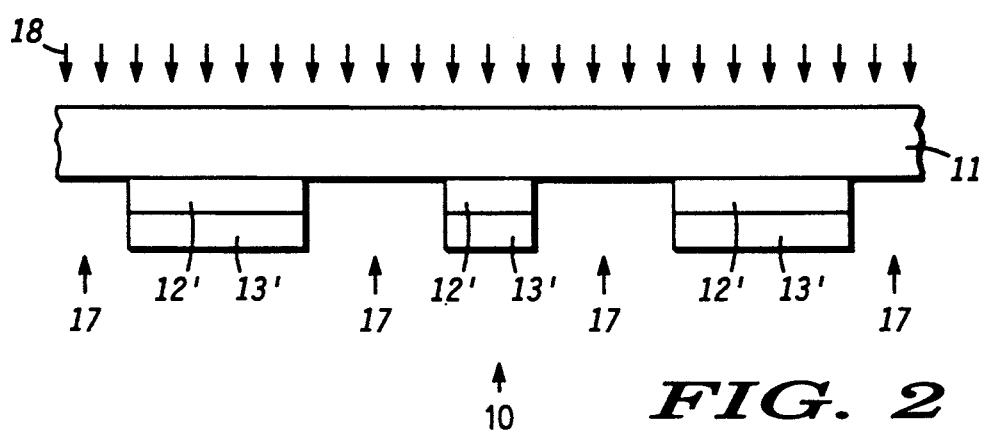
FIG. 2 illustrates an enlarged cross-section of a completed embodiment of FIG. 1 of the present invention.

Generally, mask plate 11 is made of a material that is transparent to an illumination frequency that illuminates phase-shift mask 10, as shown by arrows 18 in FIG. 2. Generally, mask plate 10 is made of quartz when illumination source is in a visible light range or an ultraviolet light range; however, it should be understood that different materials, such as soda glass can be used depending upon the illumination frequency.

A semitransmitting or a semitransparent material 12 is deposited on mask plate 11. Semitransmitting or semitransparent material 12 allows for a partial transmission of illumination 18 through semitransparent material 12. This partial transmission is commonly measured as a percent transmission of illumination that passes through semitransmitting material 12. Typically, this percent transmission ranges from 10 percent to 35 percent. In a preferred embodiment of the present invention, semitransmitting or semitransparent material 12 is made of a metal, such as see through chrome (Cr) available through TOPPAN PRINTING CO., LTD. Tokyo, Japan. However, other suitable semitransmitting materials, such as iron oxide (FeO), chromium oxide (CrO), silicon nitride ($Si_3N_4$), and aluminium (Al), that is deposited by well-known means, such as chemical vapor deposition, evaporation, or sputtering. Typically, thickness of semitransparent layer 12 is deposited in a thickness range from 100 angstroms to 2200 angstroms; however, specific thicknesses of semitransparent layer 12 are not only dependent upon specific material or materials and manner by which the specific material or materials are deposited, but also upon a desired amount of transparency that is desired.

Phase-shift layer 13 is deposited on semitransparent material 12. Typically, in a preferred embodiment of the present invention, phase-shift layer 13 is made of $Si_3N_4$; however, other materials, such as oxides, or oxynitrides may also be used. Methods of deposition of phase-shift layer 13 is dependant upon material choice. For example, silicon nitride can be deposited by Plasma Enhanced Chemical Vapor Deposition (PECVD) or by Low Pressure Chemical Vapor Deposition (LPCVD), whereas oxides may be deposited or applied by all of the above methods, as well as by sputtering and liquid method, such as Spin-On Glass (SOG). Typically, phase-shift layer 13 is deposited or applied with a thickness range from 500 angstroms to 5,000 angstroms. Generally, optimal thickness of the phase-shift layer 13 is dependent upon material selection, but also on a desired amount of change or shift in the light. Optimization of the thickness of phase-shift layer 12 is discussed in FIG. 2.

Masking layer 14 is applied as a continuous layer over semitransparent layer 13. Typically, masking layer 14 is a photoresist film that is exposed and developed to form a pattern of islands of photoresist 14 and open areas 17 that expose portions of phase-shift layer 13. It should be understood that masking layer 14 is able to define many different geometric patterns, thereby defining different geometric patterns that are used for manufacturing semiconductor devices.

FIG. 2 illustrates an enlarged cross-section a completed embodiment of FIG. 1 of the present invention.

Transferring or etching the pattern defined by masking layer 14, as shown in FIG. 1 and into phase-shift layer 13 and subsequently into semitransparent layer 12 is usually accomplished by a two-step etching process. The two-step etching process is achieved either by dry etching in a plasma, wet chemical etching, or a combination of both dry and wet etching. Generally, phase-shift layer 13 and semitransparent layer 12 (shown in FIG. 1) are etched in an anisotropic manner through open areas 17, thereby forming features 13' and 12'. In a preferred embodiment, straight sidewalls of features 13' and 12' are achieved by selecting materials and processes. For example, anisotropic dry etches remove material in a vertical direction, thereby achieving vertical sidewalls and maintaining critical dimensions. However, wet chemical etches, which are isotropic in nature, can also achieve a virtually straight sidewalls by etching thin materials. Nevertheless, since wet chemical etches are isotropic in nature, critical dimension are more difficult to maintain.

By way of example and referring to FIGS. 1 and 2, with masking plate 11 made of quartz, semitransparent layer 12 made of Cr, phase-shift layer made of $Si_3N_4$, and masking layer 14 made of photoresist, phase-shift mask 10 is made accordingly. Photoresist layer 14 is applied, exposed, and developed, thereby making photoresist feature 14 and exposing portions of silicon nitride layer 13. Silicon nitride layer 13 is etched in an anisotropic manner, thereby transferring similar dimensions from photoresist mask 14 to nitride layer 13. Typically, a fluorinated sulfur compound or a fluorinated halocarbon chemistry is used with low pressure and high power to etch silicon nitride layer 13 through opening 17. It should be understood that specific pressure and power setting are a function of specific plasma etching equipment. Etching of $Si_3N_4$ is continued until $Si_3N_4$ is completely removed from opening 17, thus forming $Si_3N_4$ feature 13' while exposing portions of semitransparent Cr layer 12 through opening 17.

Etching of semitransparent Cr layer 12 is achieved by changing the plasma chemistry. Generally, anisotropic etching of Cr is achieved by using a chlorine (Cl) based chemistry with process conditions that promote anisotropic etching of Cr, such as low pressure and high power; however, it should be understood that specific processing conditions differ between specific plasma etching equipment. Use of a Cl containing gas, such carbon tetrachloride ($CCl_4$), boron trichloride ($BCl_3$), or the like, as in this specific example, selectively etches the exposed portions of Cr layer 12 and does not appreciably etch either quartz plate 11 nor $Si_3N_4$; therefore, use of Cl based chemistry is very selective. It should be understood that other gas additives could also be used in the Cl based chemistry, such as oxygen (O), argon (Ar), helium (He), or the like. Chrome layer 12 is etched in an anisotropic manner until chrome layer 12, which is exposed through openings 17, is removed. Thus, forming feature 12' with feature 13' stacked on top and leaving portions of quartz plate 11 exposed. Once the etching sequences have been completed, photoresist layer 14 is removed. Removal of photoresist layer 14 is typically achieved by methods, such as plasma oxidation, ordinary solvents, or a combination of both. In addition, a deionized water rinse typically follows the previously described methods of removal of photoresist layer 14.

Generally, it is preferred to optimize the phase shift desired from phase-shift mask 10 to obtain a 180 degrees shift between areas 12' and 13' that are phase shifted and areas 17 that are not phase shifted. Typically, this optimization is achieved in accordance with the following equation:

$$d = \frac{L}{2(n-1)}$$

where;

d = a change in distance that light has to travel between areas that are phase shifted and areas that are not phase shifted, L = a wavelength of the illumination source, n = index of refraction of the phase-shift material.

In accordance with the above example, in order to achieve the optimal phase shift of 180 degrees, where d is thickness of phase-shift layer 12' and 13', L is the wavelength of illumination 18, e.g., 365 nanometers, and n is the refractive index of phase-shift feature 13', which is approximately 2.05 for $Si_3N_4$. Thickness of phase-shift feature 13' determined by solving for d. In this particular example, thickness of $Si_3N_4$ is 1,738 angstroms. It should be understood that semitransparent feature 12' is used to adjust for a correct transmission of light to project the pattern by phase-shift mask 10. Typically, this transmission level in a range from 10 percent to 35 percent through the semitransparent feature 12'.

Fabricating phase-shift mask 10 with this embodiment of the present invention results in the advantages and benefits of using a phase-shift mask without having an additional patterning step and without having a critical alignment. Also, using semitransparent feature 12' allows for phase-shift feature 13' to be either directly on top of or directly below semitransparent feature 13' and achieves the required phase-shifting for reducing diffraction effects, thus enhancing resolution.

Figure 3:
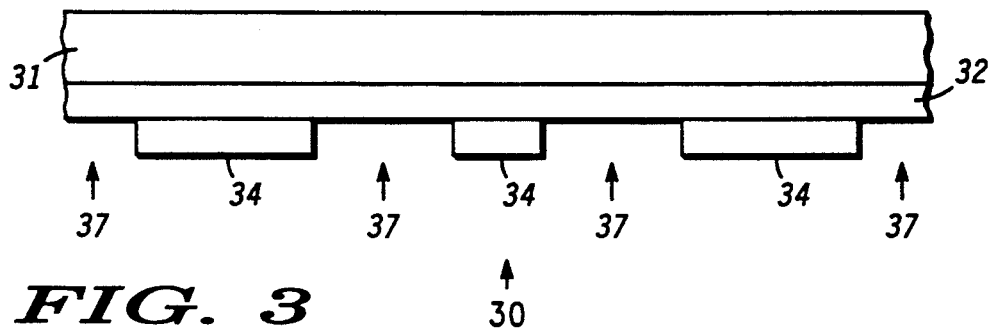
FIG. 3 illustrates an enlarged cross-section of an alternative embodiment of the present invention that is partially prepared.

FIG. 3 illustrates an enlarged cross-section of an alternative embodiment of the present invention that is partially prepared. Once again, it should be understood that only a small portion of phase-shift mask 30 is shown and that many more masking features 34 can be on phase-shift mask 30. Additionally, masking features 34 are shown patterned; however, masking layer 34 was applied as one continuous layer and was patterned by well-known methods in the semiconductor art. Also, since masking layer 34 is shown as a cross-section, many different geometric shapes or patterns could be represented. In the present invention, a combination of processes and materials are used for making and using a novel phase-shift mask.

Figure 4:
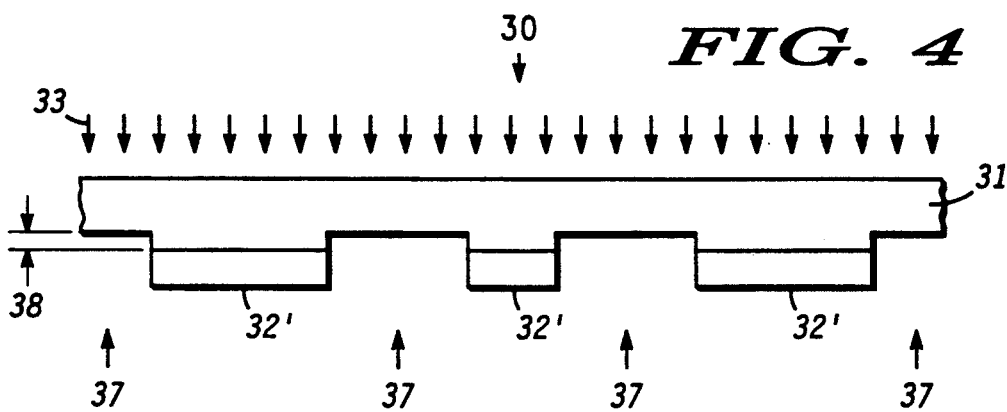
FIG. 4 illustrates an enlarged cross-section of a completed embodiment of FIG. 3 of the present invention.

Typically, mask plate 31 is made of a material that is transparent to an illumination frequency that illuminates phase-shift mask 30, as shown by arrows 33 in FIG. 4. It should be understood that many different materials can be used depending upon the illumination frequency. Generally, mask plate 31 is made of quartz when illumination source is in visible light or in ultra violet light.

A semitransparent material 32 is deposited on mask plate 31 using similar materials and thickness as for layer 12 of FIG. 1. Additionally, masking layer 34 is applied, exposed, and developed to form a pattern that is defined by features 34 as for patterned photoresist 14 of FIG. 1 also previously discussed.

FIG. 4 illustrates an enlarged cross-section of a completed embodiment of FIG. 3, an alternate embodiment of the present invention;

Transferring or etching of the pattern defined by masking layer 34 into semitransparent layer 32 is usually achieved by either a dry plasma chemistry or a wet chemical chemistry, as was previously discussed in FIG. 2. In this alternative embodiment it is preferred to use a dry plasma chemistry to etch or to transfer the pattern of features 34, thereby achieving straight sidewalls and maintaining dimensional control.

By way of example, with masking plate 31 made of quartz, semitransparent layer 32 made of Cr, and masking layer 34 made of photoresist, phase-shift mask 30 is made in accordance with the present invention. Photoresist layer 34 is applied, exposed, and developed, thereby exposing portions of semitransparent layer 32 while covering or protecting other portions of semitransparent layer 32. Semitransparent layer 32 is etched typically in an anisotropic manner, thereby transferring similar dimensions of opening 37 from photoresist layer 34 into semitransparent layer 32. Typically, in a preferred embodiment of the present invention, a chlorine based plasma chemistry is used to etch or to transfer the pattern defined in photoresist layer 34 into semitransparent layer 32. The process conditions needed to achieve the desired results have been previously discussed in FIG. 2. Etching of semitransparent Cr layer 32 is continued until complete removal of Cr is achieved in opening 37, thus exposing portions of quartz masking plate 31.

Pattern transfer or etching is continued into quartz plate 11 by changing the plasma chemistry to a fluorine-based chemistry. In a preferred embodiment of the present invention, a fluorinated halocarbon gas, such as trifluoromethane or tetrafluoromethane is used; however, other fluorine containing gases may also be used. Etching of quartz masking plate 11 is continued until a predetermined depth is achieved, thereby creating a phase-shift area in quartz mask plate 31. Once the etching of quartz mask plate is complete and a correct depth has been reach in opening 37, the etch is extinguished.

Removal of remaining photoresist 32 is typically achieved by methods, such as plasma oxidation, commonly used solvents, or a combination of both. Additionally, a water rinse typically follows the previously described removal methods for photoresist.

Phase-shift optimization to a 180 degree shift between areas that are phase shifted and areas that are not phase shifted is achieve in accordance with the previously discussed embodiment.

However, in accordance with the above example, determination of etch depth 38 to achieve an optimal 180 degree phase-shift is done by solving for d in the previously discussed equation. Additionally, L is the wavelength of illumination 33 in nanometers, e.g., 365 nanometers, and n is the refractive index of the phase-shift material, which is approximately 1.45 for quartz.

In this alternative embodiment of the present invention, only one masking step is required to achieve phase-shift mask 30. Additionally, since fabrication is greatly simplified, less contamination, such as particles or the like is generated.

Figure 5:
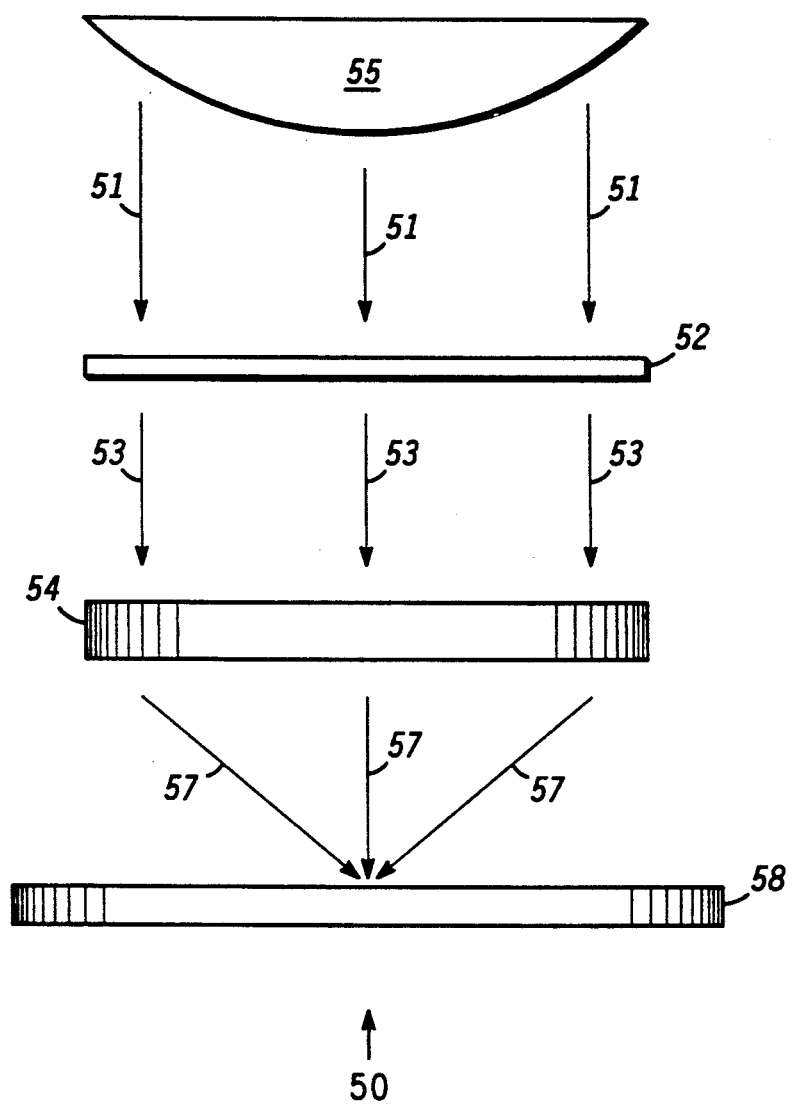
FIG. 5 pictorially illustrates an optical system that uses the present invention.

FIG. 5 pictorially illustrates an optical system or camera 50 that uses the present invention. Generally, illumination source 55 is a mercury arc lamp which emits commonly used frequencies, such as I-line (365 nanometers) and G-line (436 nanometers). However, other sources of illumination can be used, such as deep ultraviolet, and ultraviolet. Arrows 51 illustrate illumination that is directed from illumination source 55 towards a phase-shift mask 52 which can be mask 10 or 30. The illumination, that is depicted by arrows 51, then passes through phase-shift mask 52, where the illumination wave form changes. Arrows 53 illustrate the effective illumination after passing through phase-shift mask 52. Illumination depicted by arrows 53 falls on a lense 54. Typically, lense 54 is a reduction lense which reduces an image that is made by phase-shift mask 52. This reduced image is projected onto a surface of a semiconductor substrate. Arrows 57 represent the projection of the reduced image from lense 54 to semiconductor substrate 58.

By now it should be appreciated that a novel method of making and using a phase-shift mask has been described. The novel phase-shift mask reduces diffraction problems found in conventional masks. Additionally, by using a semitransparent layer and creating phase-shift elements as described in the present invention, it is easier to design and to utilize phase-shift photolithography.

I claim:

1. A method for making a phase-shift mask comprising, the steps of:
   providing a mask plate;
   depositing a semitransparent layer having a percent transmission from approximately 10 percent to 35 percent on the mask plate;
   depositing a phase-shift layer on the semitransparent layer;
   applying a photosensitive layer onto the phase-shift layer;
   defining the photosensitive layer into geometric patterns, wherein portions of the phase-shift layer are exposed, while other portions of the phase-shift layer are covered by the photosensitive layer;
   etching the exposed portions of the phase-shift layer, thereby transferring the geometric patterns from the photosensitive layer into the phase-shift layer and exposing portions of the semitransparent layer; and
   etching the exposed portions of the semitransparent layer, transferring the geometric patterns from the phase-shift layer into the semitransparent layer, thereby producing geometric patterns of both the phase-shift layer and the semitransparent layer with substantially identical dimensions.

2. A method for making a phase-shift mask as claimed in claim 1 wherein the depositing of the semitransparent layer having a percent transmission range from approximately 10 percent to 35 percent is accomplished by depositing a metal.

3. A method for making a phase-shift mask as claimed in claim 2 wherein the depositing of the metal having a percent transmission range from approximately 10 percent to 35 percent is accomplished by depositing the metal with a thickness ranging from 100 angstroms to 2,200 angstroms.

4. A method for making a phase-shift mask as claimed in claim 3 wherein the depositing of the metal having a percent transmission range from approximately 10 percent to 35 percent is accomplished by depositing chrome.

5. A method for making a phase-shift mask as claimed in claim 1 wherein the depositing of the phase-shift layer is accomplished by depositing a layer of nitride.

6. A method for making a phase-shift mask as claimed in claim 5 wherein the depositing of the nitride is deposited with a thickness ranging from 500 angstroms to 5,000 angstroms.

7. A method for making a phase-shift mask as claimed in claim 4 wherein the depositing of the phase-shift layer is accomplished by depositing a layer of silicon nitride.

8. A method for making a phase-shift mask as claimed in claim 1 wherein the etching of the exposed portions of the phase-shift layer and the semitransparent layer is accomplished by using an anisotropic etch.

9. A method for making a phase-shift mask as claimed in claim 1 further comprising the step of removing the photosensitive layer from portions of the phase-shift layer after completion of the etching.

10. A phase-shift mask comprising:
    a masking plate;
    a patterned semitransparent layer having a percent transmission ranging from approximately 10 percent to 35 percent; and
    a patterned phase-shift layer that is super imposed on the semitransparent layer.

11. A phase-shift mask as claimed in claim 10 wherein the patterned semitransparent layer and the patterned phase-shift layer are reversed in order.

12. A phase-shift mask as claimed in claim 10 wherein the patterned semitransparent layer and the patterned phase-shift layer have dimensions that are the same.

13. A process for making a phase-shift mask comprising, the steps of:
    providing a mask plate;
    depositing a semitransparent layer having a percent transmission ranging from approximately 10 percent to 35 percent on the mask plate;
    depositing a phase-shift layer on the semitransparent layer;
    patterning both the phase-shift layer and the semitransparent layer to form a stacked geometric pattern that covers portions of the mask plate while other portions of the mask plate are exposed.

14. A method for projecting patterns onto a semiconductor substrate comprising, the steps of:
    providing an illumination source;
    providing a phase-shift mask that uses a semitransparent material having a percent transmission range from approximately 10 percent to 35 percent in conjunction with a phase-shift material to provide a pattern that is projected;
    providing a lens system that receives the pattern that is projected from the phase-shift mask;
    reducing the pattern in the lens system; and
    projecting the reduced pattern onto a semiconductor substrate.

* * * * *